United States Patent [19]

Sakakibara

[11] Patent Number: 5,295,110
[45] Date of Patent: Mar. 15, 1994

[54] SEMICONDUCTOR MEMORY DEVICE INCORPORATED WITH SELF-REFRESH CIRCUIT

[75] Inventor: Kenichi Sakakibara, Tokyo, Japan
[73] Assignee: NEC Corporation, Tokyo, Japan
[21] Appl. No.: 11,261
[22] Filed: Jan. 29, 1993
[30] Foreign Application Priority Data
Jan. 30, 1992 [JP] Japan .................. 3-040325
[51] Int. Cl.[5] ............................. G11C 7/00
[52] U.S. Cl. ......................... 365/222; 365/236
[58] Field of Search ....................... 365/222, 236

[56] References Cited

U.S. PATENT DOCUMENTS 4,716,551 12/1987 Inagaki ................. 365/222
4,989,183 1/1991 Kumanoya et al. ......... 365/222

OTHER PUBLICATIONS

1990 IEEE International Solid-State Circuits Conference, pp. 230, 231 and 303, Konishi et al., "A 38 ns 4 Mb DRAM with a Battery Back-Up (BBU) Mode".

Primary Examiner—Eugene R. LaRoche
Assistant Examiner—Andrew Q. Tran
Attorney, Agent, or Firm—Laff, Whitesel, Conte & Saret

[57] ABSTRACT

A DRAM incorporated with a self-refresh circuit is disclosed which includes at least one terminal (bonding pad) optionally supplied with a first or a second potential level, a row address buffer/decoder having an input node coupled to the terminal to receive the potential level thereof and energizing a first number of word lines when the input node is at the first potential level and a second number of word lines when the input node is at the second potential level, a gate circuit inserted between the terminal and the input node of the address buffer/decoder and activated in the self-refresh mode to hold the input node at the first potential irrespective of the potential level of the terminal, a refresh timer activated in the slef-refresh mode for generating a refresh request signal in a predetermined cycle, and a refresh controller responding to the refresh request and refreshing memory cells connected to the energized first number of word lines.

6 Claims, 4 Drawing Sheets

SEMICONDUCTOR MEMORY DEVICE INCORPORATED WITH SELF-REFRESH CIRCUIT

BACKGROUND OF THE INVENTION

The present invention relates to a semiconductor memory device and, more particularly, to a dynamic random access memory (DRAM) incorporated with a self-refresh circuit.

It is indispensable for a DRAM to refresh each memory cell in order to retain data stored therein. The refresh operation must be performed on each memory cell at least once within a period during which each memory cell can hold data stored therein without destroying it. This period is called hereinafter "data hold-enable period".

In one way of refreshing, external control signals such as a row address strobe (RAS) signal and a column address strobe (CAS) signal are employed. The so-called RAS-only-Refresh and CAS-before-RAS Refresh are well known in the art. While a refresh cycle, i.e. a time interval of each refresh operation, is designated by a DRAM maker, in order to satisfy a demand for a system design from users, the DRAM maker supplies different types of DRAMs with respect to a required refresh period. For example, one type DRAM specifies that a refresh operation is required to be performed 1024 times within a 16 msec period. Such a DRAM is called 1K-type DRAM. Another type DRAM is called 2K-type DRAM and specifies that a refresh operation has to be performed 2048 times with a 32 msec period. Still another type DRAM is called 4K-type DRAM and specifies that a refresh operation has to be performed 4096 times within a 64 msec period.

Assuming here that those 1K-type, 2K-type and 4K-type DRAMs have the same memory capacity as one another and hence have the same number of word lines as one another, the word lines are energized in response to every refresh operation one by one in the 4K-type DRAM, two by two in the 2K-type DRAM and four by four in the 1K-type DRAM. Therefore, the DRAM maker produces, in place of producing chips for those DRAMs independently of one another, a common chip for them but equipped with a bonding option function. In the common chip with the bonding option, two bonding pads are provided, each of which is connected to a power potential or a ground potential by a bonding wire. The potential levels of the bonding pads are supplied to a row address buffer and/or a row address decoder. Thus, when the combination of the potential levels designates the 1K-type, four word lines are energized simultaneously by some refresh address. In the case of designating the 2K-type or 4K-type, two word lines or one word line is energized by that refresh address.

In another way for refreshing, a DRAM itself performs a refresh operation by a self-refresh circuit incorporated therein, as disclosed in Digest of Technical Papers of "1990 IEEE International Solid State Circuits Conference", pp. 230, 231 and 303. The self-refresh circuit includes a refresh timer and a refresh address generator. The timer generates a refresh timing signal in a predetermined cycle such that all the memory cells are refreshed at least once within the data hold-enable period. This predetermined cycle is called a self-refresh cycle. Each time the refresh timing signal is generated, a word line selected by a row address from the refresh address generator is energized to refresh the memory cells connected to the selected word line. The refresh address is thereafter incremented or decremented by one.

Consider now that the self-refresh circuit would be incorporated into the above-mentioned chip with the bonding option. In this case, if the 1K-type is designated, since four word lines are energized simultaneously each time a self-refresh operation is performed, it is performable to expand the self-refresh cycle. Otherwise, each of word lines is energized many times within the data hold-enable period, resulting in increase in power consumption. In the case of designating the 4K-type, on the other hand, since only one word line is energized by every refresh operation, it is preferable to make the self-refresh cycle short. Otherwise, the energization of all the word lines is not completed within the data hold-enable period, and some word lines may remain without being energized. Thus, the self-refresh cycle should be varied in accordance with the designation by the bonding option.

For this purpose, a plurality of refresh timers would be provided to generate a plurality of refresh timing signals having refresh cycles different from one another. A selector would be also required to select one of the refresh timing signals in accordance with the designation by the bonding option. As result, a DRAM thus produced has complicated hardware.

SUMMARY OF THE INVENTION

It is therefore an object of the present invention to provide a DRAM having a bonding option and a self-refresh circuit for refreshing all the memory cells in a self-refresh operation without increasing hardware and power consumption.

A DRAM according to the present invention comprises at least one bonding pad which takes one of first and second potential levels, a memory cell array having a plurality of word lines, a word line energizing circuit having an input node coupled to receive the potential level of the bonding pad and energizing in a refresh operation a first number of the word lines when the input node is at the first potential level and a second number of the word lines when the input node is at the second potential level with respect to a refresh address, a refresh timer activated in a self-refresh mode for generating a refresh request signal in a predetermined cycle, and a gate circuit inserted between the bonding pad and the input node of the word line energizing circuit and activated in the self-refresh mode to hold the input node of the word line energizing circuit at the first potential level irrespective of the potential level of the bonding pad.

Thus, the potential level to be supplied to the word line energizing circuit such as an address buffer/decoder is fixed in the self-refresh mode at the first potential level even if the bonding pad is applied with the second potential level. The word line energizing circuit thus energizes the first number of word lines in the self-refresh mode with respect to a refresh address. The refresh timer generates a refresh request signal in a cycle corresponding to the number of word lines to be simultaneously energized every self-refresh operation. For example, if the cycle of the refresh request signal from the refresh timer is designed to be short correspondly to the 4K-type, the word line activating circuit energizes one word line every self-refresh operation even when the potential level of the bonding pads designates the 1K-type. Accordingly, all the memory cells are refreshed at least one within the data hold-enable. On the other hand, when the refresh timer is designed to generate a refresh request signal which has a relatively long cycle correspondingly to the 1K-type, the input node of the word line energizing circuit is held at the second potential level to energize four word lines every self-refresh operation even if the bonding pad takes the level designating the 4K-type. Therefore, power consumption in the slef-refresh mode is lowered.

The memory device thus constructed has only to comprise one refresh timer and a gate circuit and performs a self-refresh operation on all the memory cells within the data-enable period without increasing power consumption.

BRIEF DESCRIPTION OF THE DRAWINGS

The above-mentioned and other objects, features and advantages of this invention will become more apparent by reference to the following detailed description taken in conjunction with the accompanying drawings, wherein.

DETAILED DESCRIPTION OF THE INVENTION

Figure 1:
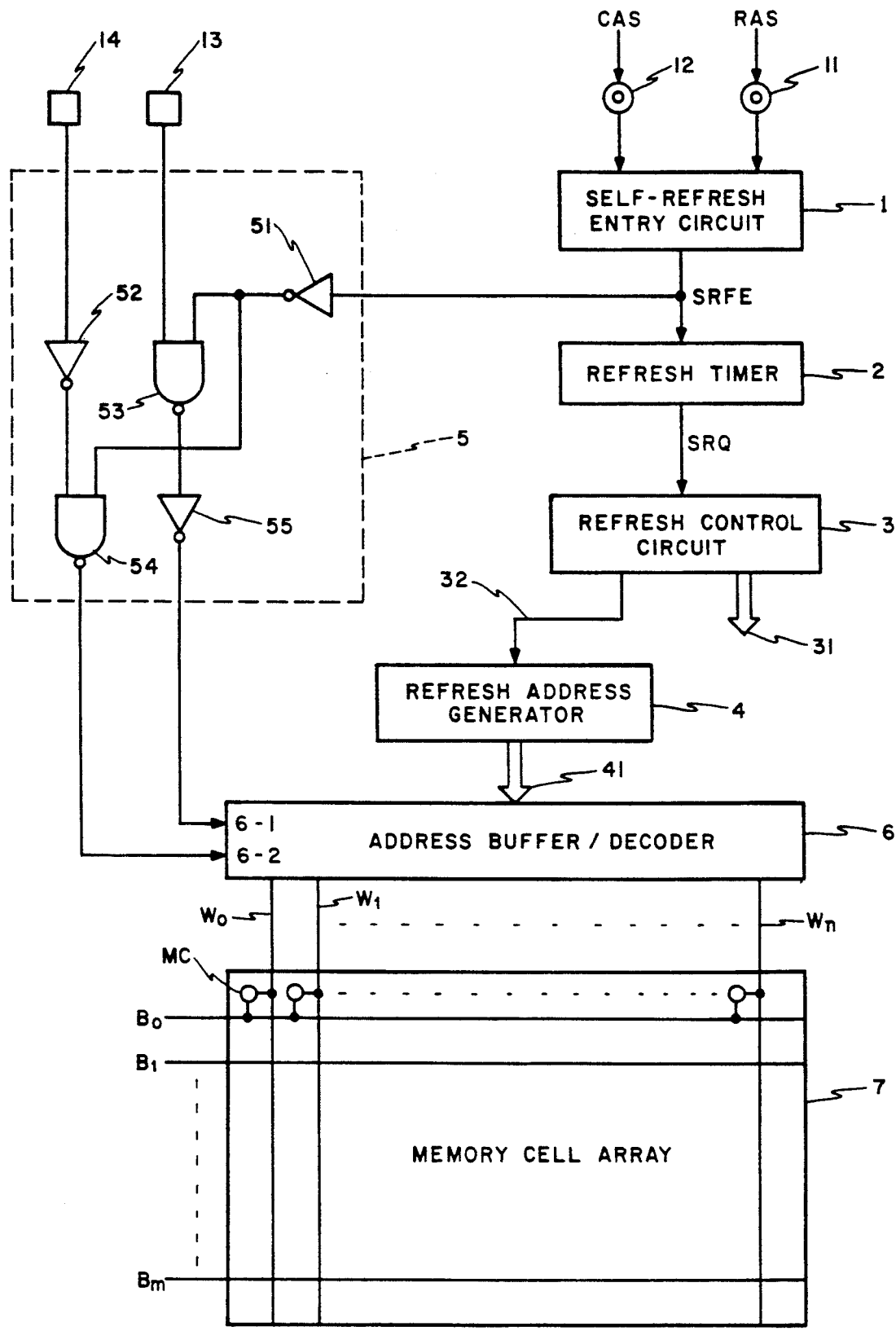
FIG. 1 is a block diagram of the first embodiment of the present invention.

Referring to FIG. 1, there is shown a DRAM according to an embodiment of the present invention. It should be noted that only a circuit portion concerning a self-refresh operation is shown in the drawings. This DRAM includes terminals 11 and 12 supplied respectively with a RAS signal and a CAS signal and further includes bonding pads or terminals 13 and 14. Each of the terminals 13 and 14 is supplied optionally with a ground potential or a power potential via a bonding wire (not shown). If desired, there may be provided a programable circuit to supply the ground or power potential to the terminals 13 and 14. These terminals 13 and 14 are connected to input nodes 6-1 and 6-2 of an address buffer/decoder 6 through a gate circuit 5 which will be described later in detail. The address buffer/decoder 6 responds to a row address supplied thereto and energizes one or more of word lines Wo to Wn of a memory cell array 7 which also has a plurality of bit lines Bo to Bm and a plurality of memory cells MC. In a data read/write mode, the address buffer/decoder 6 energizes one word line in response to a data read/write address. In a refresh mode, on the other hand, the address buffer/decoder 6 energizes one, two or four word lines simultaneously with one another in response to a refresh address. The logic combination of the low level (i.e., ground potential) and the high level (i.e., power potential) at the input nodes 6-1 and 6-2 results in the energization of four word lines as the above-mentioned 1K-type. The logic combination of the high and low levels at the nodes 6-1 and 6-2 results in the energization of one word line as the 4K-type, and that of the high levels at both nodes 6-1 and 603 results in the energization of two word lines as the 2K-type. Since the circuit construction for changing the number of the word lines to be energized is well known in the art and does not relate directly to the present invention, the further description of the address buffer/decoder 6 will be omitted.

The gate circuit 5 includes three inverters 51, 52 and 55 and two NAND gates 53 and 54 which are connected as shown. Accordingly, when a self-refresh enable signal SRFE from a self-refresh entry circuit 1 takes an inactive low level to represent modes other than a self-refresh mode, the potentials at the terminals 13 and 14 are supplied through the gate circuit 5 to the input nodes 6-1 and 6-2, respectively. On the other hand, when the self-refresh enable signal SRFE takes an active high level to represent the self-refresh mode, the potentials at the nodes 6-1 and 6-2 are held at the low level and the high level, respectively, irrespective of the potentials at the terminals 13 and 14. This causes the address buffer/decoder 6 to energizes four word lines in response to a refresh address supplied thereto. As apparent from the above description, the low and high levels at the terminals 13 and 14 designate the 1K-type, and the high and low levels thereat designate the 4K-type. The 2K-type is designated by the high levels at the terminals 13 and 14.

Figure 2:
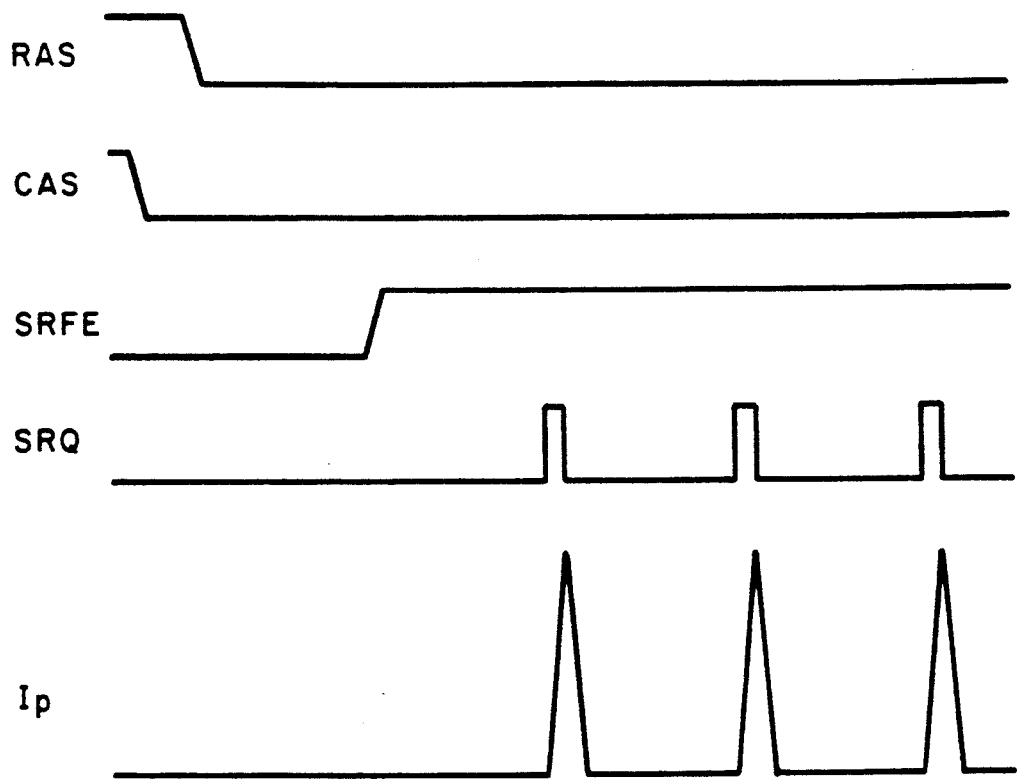
FIG. 2 is a waveform diagram for the circuit of the first embodiment.

The self-refresh entry circuit 1 checks the potential level of the terminals 11 and 12 to detect whether or not the present DRAM is brought into a self-refresh mode. As well known in the art and also shown in FIG. 2, the self-refresh mode is brought by changing the RAS signal from the high level to the low level while keeping the CAS signal at the low level and by then holding both of the RAS and CAS signals at the low level. The circuit 1 detects that condition and then changes the self-refresh enable signal SRFE to the active high level, as shown in FIG. 2. The active high level of the signal SRFE activates a refresh timer 2 which thereby generates a refresh request signal SRQ in a first cycle, as shown in FIG. 2. This cycle corresponds to the 1K-type and thus is relatively long, because four word lines are simultaneously activated in response to one self-refresh address, as described above. The refresh address 41 is generated by a refresh address generator 4 and supplied to the address buffer/decoder 4.

Each time the refresh request signal SRQ is generated, a refresh control circuit 3 generates a set of refresh control signals 31 to refresh memory cells (not shown) in the memory cell array 7 connected to the energized four word lines. When the refresh operation responsive to the refresh request signal SRQ is completed, the circuit 3 generates an address updating signal to increment or decrement the content, i.e. refresh address, of the address generator 4.

Since four word lines W are energized and the memory cells coupled thereto are refreshed every self-refresh operation, a current consumed by each self-refresh operation in the DRAM is relatively large, as shown by Ip in FIG. 2. However, the cycle of the refresh request signal SRQ is relatively long, an average current consumed in the whole self-refresh operation is lowered.

Figure 3:
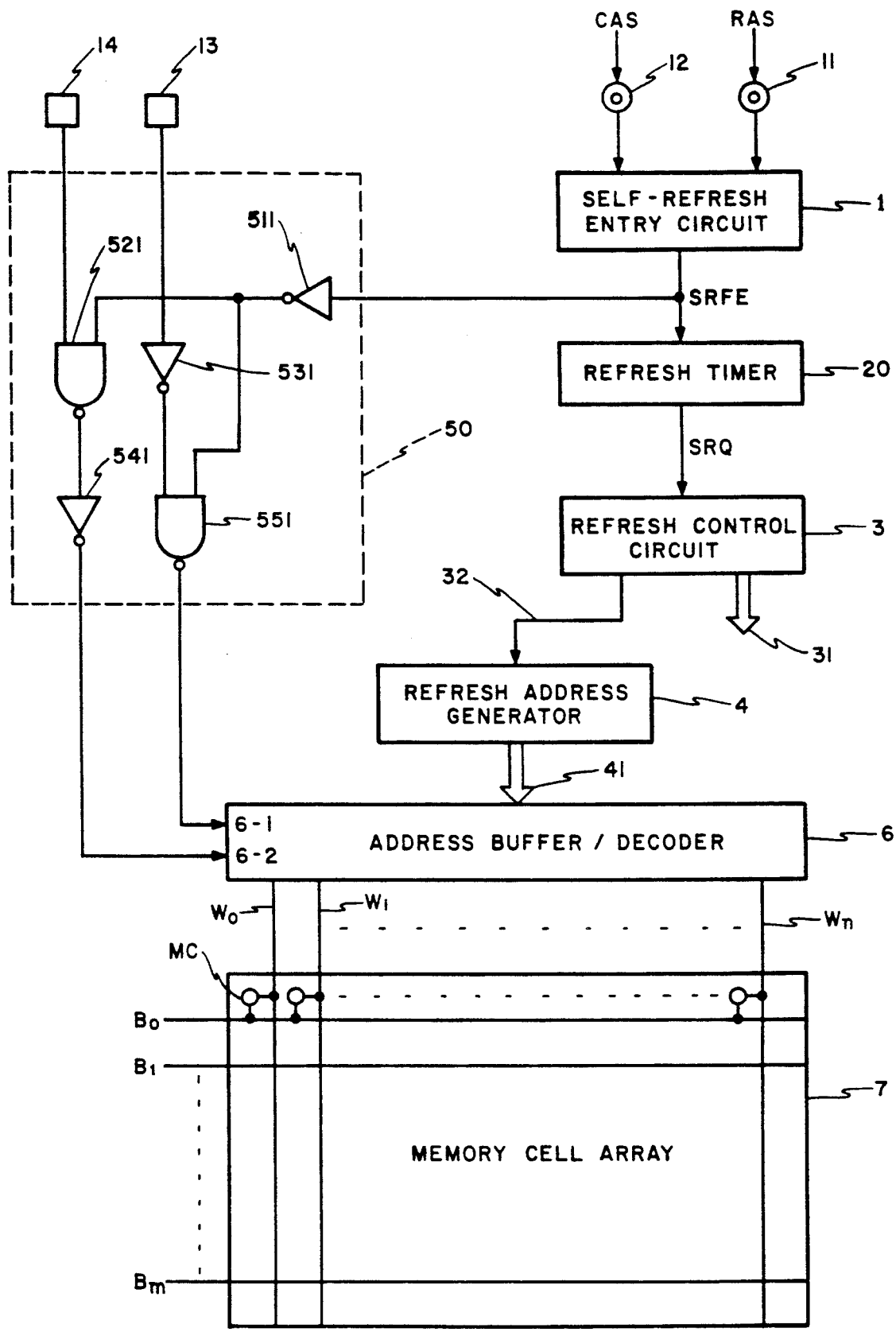
FIG. 3 is a block diagram of an another embodiment of the present invention.

Referring to FIG. 3, there is shown another embodiment of the present invention in which the same constituents as those shown in FIG. 1 are denoted by the same reference numerals to omit the further description thereof. In this embodiment, a refresh timer 20 generates, when activated by the active high self-refresh enable signal SRFE, a refresh request signal SRQ having a second cycle designed to be relatively short correspondingly to the 4K-type. This means that the address buffer/decoder 6 is required to energize one word line W in response to one refresh address. For this purpose, a gate circuit 50 includes three inverters 511, 531 and 541 and two AND gates 521 and 551. That is, the active high level of the self-refresh enable signal SRFE causes the gate circuit 50 to hold the input nodes 6-1 and 6-2 of the address buffer/decoder 6 at the high level and the low level, respectively, irrespective of the levels of the terminals 13 and 14.

Figure 4:
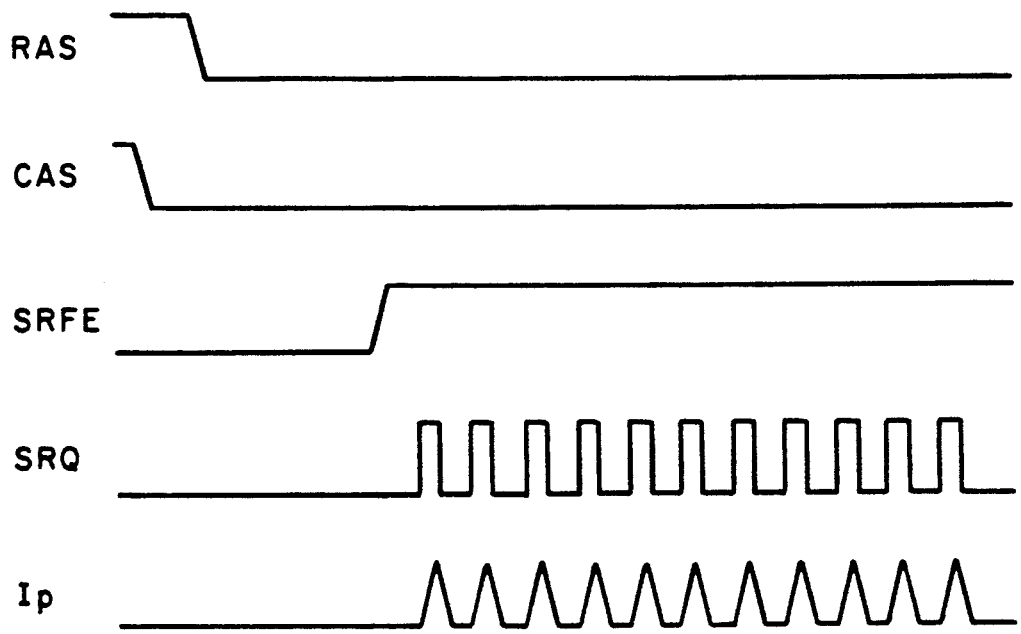
FIG. 4 is a waveform diagram for the circuit of FIG. 3.

In the self-refresh mode of the present DRAM, since the refresh request signal SRQ is generated in relatively short cycle, the address buffer/decoder 6 energizes one word line every refresh operation, so that all the memory cells are refreshed at least oncewithin the data hold-enable period. Power consumption occurs frequently, but the peak value of a current every refresh operation is small, as shown by Ip in FIG. 4, so that an average in-circuit consumption is almost same as that in the DRAM in FIG. 1.

Figure 5:
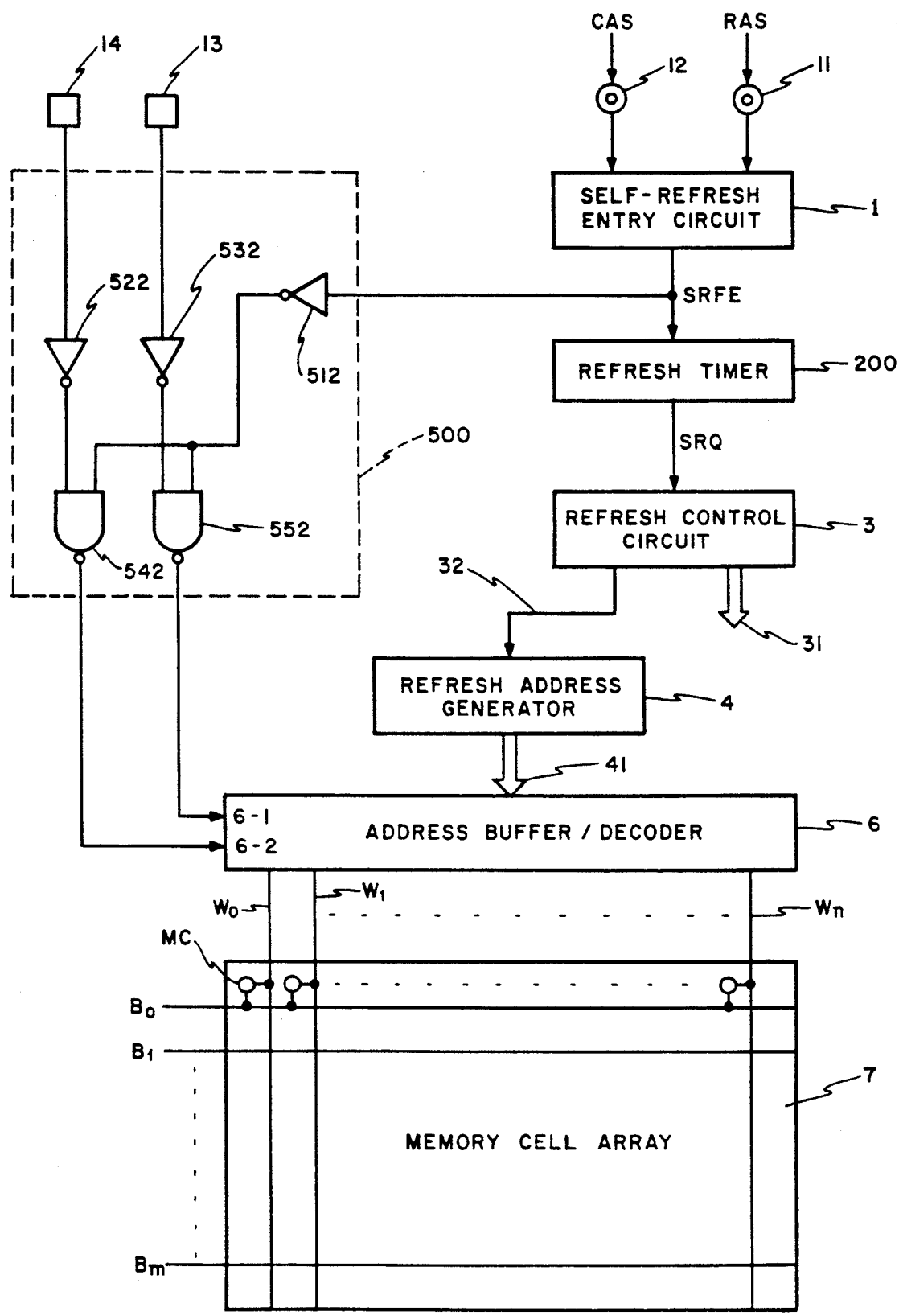
FIG. 5 is a block diagram of a still another embodiment of the present invention.

Turning to FIG. 5, there is shown a still another embodiment in which the same constitutes as those shown in FIG. 1 are denoted by the same reference numerals to omit the further description thereof. In this embodiment, a refresh timer 200 generates a refresh request signal SRQ have a third cycle intermediate between the first and second cycles. Therefore, a gate circuits 500 includes three inverters 512, 522 and 532 and two AND gates 542 and 552 which are connected as shown in the drawing. That is, the active high level of the self-refresh enable signal SRFE causes the gate circuit 500 to hold both of the node 6-1 and 6-2 at the high level. As a result, the address buffer/decoder 6 energizes two word lines every self-refresh operation.

It is apparent that the present invention is not limited to the above embodiments but may be changed and modified without departing from the scope and spirit of the invention. For example, one of the terminals 13 and 14 can be omitted to support the 1K-type and 4K-type, 1K-type and 2K-type, or 2K-type and 4K-type. Further, the logic levels at the terminals 13 and 14 and nodes 6-1 and 6-2 for designating the respective types can be changed to other ones.

What is claimed is:

1. A semiconductor memory comprising at least one terminal taking one of first and second potential levels, a memory cell array including a plurality of memory cells and a plurality of word lines, a word line energizing circuit having an input node coupled to said terminal to receive a potential level of said terminal and energizing in a refresh operation a first number of said word lines when said input node is at said first potential level and a second number of said word lines when said input node is at said second potential level with respect to one refresh address, a refresh timer activated in a self-refresh mode and generating a refresh request signal in a predetermined cycle, a gate circuit inserted between said terminal and said input node of said word line energizing circuit and activated in said self-refresh mode to hold said input note at said first potential level irrespective of the potential level of said terminal, and a refresh controller responding to said refresh request signal and refreshing the memory cells connected to the energized first number of word lines.

2. The semiconductor memory as claimed in claim 1, wherein said first number is larger than said second number and said refresh timer generates said refresh request signal in a long cycle.

3. The semiconductor memory as claimed in claim 2, wherein said first number is smaller than said second number and said refresh timer generates said refresh request signal in a short cycle.

4. A semiconductor memory comprising means for detecting said memory is brought into a self-refresh mode to produce a self-refresh enable signal, a memory cell array including a plurality of word lines, means coupled to receive control information for energizing a first number of said word lines when said control information takes a first state and a second number of said word lines when said control information takes a second state in response to a refresh address supplied thereto, means responsive to said self-refresh enable signal for allowing, when said control information takes said first state, said first state to be supplied to said energizing means and for changing, when said control information takes said second state, said second state to said first state to supply said first state to said energizing means, said energizing means thereby energizing said first number of word lines in said self-refresh mode, means activated by said self-refresh enable signal for generating a refresh request signal in a predetermined cycle, and means responsive to said refresh request signal for refreshing memory cells coupled to the energized first number of word lines.

5. The semiconductor memory as claimed in claim 4, further comprising a terminal supplied with one of first and second potential levels, said control information takes said first state when said terminal is supplied with said first potential level and said second state when said terminal is supplied with said second potential level.

6. A method for refreshing memory cells in a semiconductor memory which has a word line energizing circuit for energizing a first number of word lines in a first state and a second number of word lines in a second state, comprising the steps of: detecting that said semiconductor memory is brought into a self-refresh mode, bringing said word line energizing circuit into said first state whenever said semiconductor memory is brought into a self-refresh mode, supplying a refresh address to said word line energizing circuit in said self-refresh mode to cause said word line energizing circuit to energize said first number of word lines, activating a refresh timer in said self-refresh mode to cause said refresh timer to generate a refresh-request signal in a pre-determined cycle, and refreshing memory cells connected to the energized first number of word lines in response to said refresh request signal.

* * * * *